US005563590A

United States Patent [19]

Mira

[11] Patent Number: 5,563,590
[45] Date of Patent: Oct. 8, 1996

[54] PROCESS AND DEVICE FOR SECURING DATA MIXED INTO AN IMAGE

[75] Inventor: Silvio Mira, Wermatswil, Switzerland

[73] Assignee: Multanova AG, Switzerland

[21] Appl. No.: 98,063

[22] Filed: Jul. 28, 1993

[30] Foreign Application Priority Data

Aug. 14, 1992 [CH] Switzerland ............. 02 547/92

[51] Int. Cl.⁶ .................................................. G08G 1/01
[52] U.S. Cl. ........................ 340/936; 348/149; 364/438
[58] Field of Search .......................... 340/936, 937; 348/149; 364/438

[56] References Cited

U.S. PATENT DOCUMENTS

| | | | |
|---|---|---|---|
| 3,165,373 | 7/1962 | Scott | 340/937 |
| 4,922,339 | 5/1990 | Stout et al. | 340/937 |
| 4,988,994 | 1/1991 | Loeven | 340/936 |
| 5,041,828 | 8/1991 | Loeven | 340/936 |

FOREIGN PATENT DOCUMENTS 2266398 10/1993 United Kingdom ................. 340/937

*Primary Examiner*—Jeffery Hofsass
*Assistant Examiner*—Daniel J. Wu
*Attorney, Agent, or Firm*—Burns, Doane, Swecker & Mathis

[57] ABSTRACT

In an automatic speed monitoring system of the type in which data is incorporated into a photograph of a vehicle, security of the data is provided through the addition of redundant information to the recorded data. The data is processed to derive an alphanumeric test symbol that is based on the data symbols. This test symbol is recorded along with the data. In subsequent validation of the data, the data is processed in the same manner to derive a symbol, and this symbol is compared with the recorded test symbol to determine the correctness of the recorded data.

8 Claims, 2 Drawing Sheets

$\underset{2}{)}\underline{D\ 02.04.92\ h\ 11:09:42\ v=153\,km/h}\ \overset{P}{y}$ 68  50  48  46  50  104  49  48  58  50  118  49  51  109  104  121
48  46  52  57  32  49  58  57  52  32  61  53  107  47  32

Q = 68+48+50+...+47+104+32 = 1785

1785 mod 128 = 121

PROCESS AND DEVICE FOR SECURING DATA MIXED INTO AN IMAGE

FIELD OF THE INVENTION

The present invention relates to a process and a device for validating data that is incorporated into an image in the form of alphanumeric symbols.

BACKGROUND OF THE INVENTION

The validation of data that is incorporated into an image is always necessary in circumstances in which the image is used, together with the data, for evidentiary purposes, as takes place for example in the automatic monitoring of traffic, where infringements of traffic regulations are contemporaneously recorded in a tangible form. This may occur, for example, where an offending vehicle is photographed and the corresponding data such as speed, date and time are incorporated into the image on the film, in the form of alphanumeric symbols. In this case, the conversion of electrical data signals into the symbols to be transferred optically onto the film takes place by means of known display elements, such as for example light-emitting diodes.

To demonstrate that the process of adding the data to the image is correct and the symbols which are visible on the image actually represent the data intended to be incorporated into the image, it is known inter alia to monitor the electrical properties of the display elements. This preferably takes place by detection or measurement of the current through the light-emitting diode segments during the process of adding the data. Since, however, there is no guarantee that a light-emitting diode exhibiting the expected electrical properties will also behave correctly from the optical point of view, in that it actually also illuminates for example when current flows through it, this method is not sufficient for evidentiary purposes.

Another known method consists in providing, at the start and possibly also at the end of each film, test exposures with predetermined data or patterns that are added to the images, and checking these subsequently. Even this method is not unequivocally reliable evidence, since it does not guarantee that the incorporation of the data has also correctly functioned in the case of any desired image before or after the test exposure.

OBJECT AND SUMMARY OF THE INVENTION

The object of the invention is to provide a process and a device for carrying out the process, which permit the data recording process to be checked for accuracy with respect to any selectable image, without test images or test data having to be relied upon or measurements having to be made on the display elements.

With the process according to the invention, this object is achieved by adding redundancy in the form of an additional test information item. This test information item is formed by a combination of at least individual symbols of the data in accordance with a defined algorithm. It is added to the data and incorporated into the image.

The device for implementing the invention includes a table, in which a numerical value is allocated to each possible data symbol. The numerical values allocated to the individual data symbols are processed to form a test information item representative of the data to be incorporated in the image. An alphanumeric display adds this test information item to the image in the form of a test symbol.

BRIEF DESCRIPTION OF THE DRAWINGS

In the text which follows, the invention is explained in greater detail with reference to an illustrative embodiment shown in the drawings, in which.

DETAILED DESCRIPTION

Figures 1, 2:
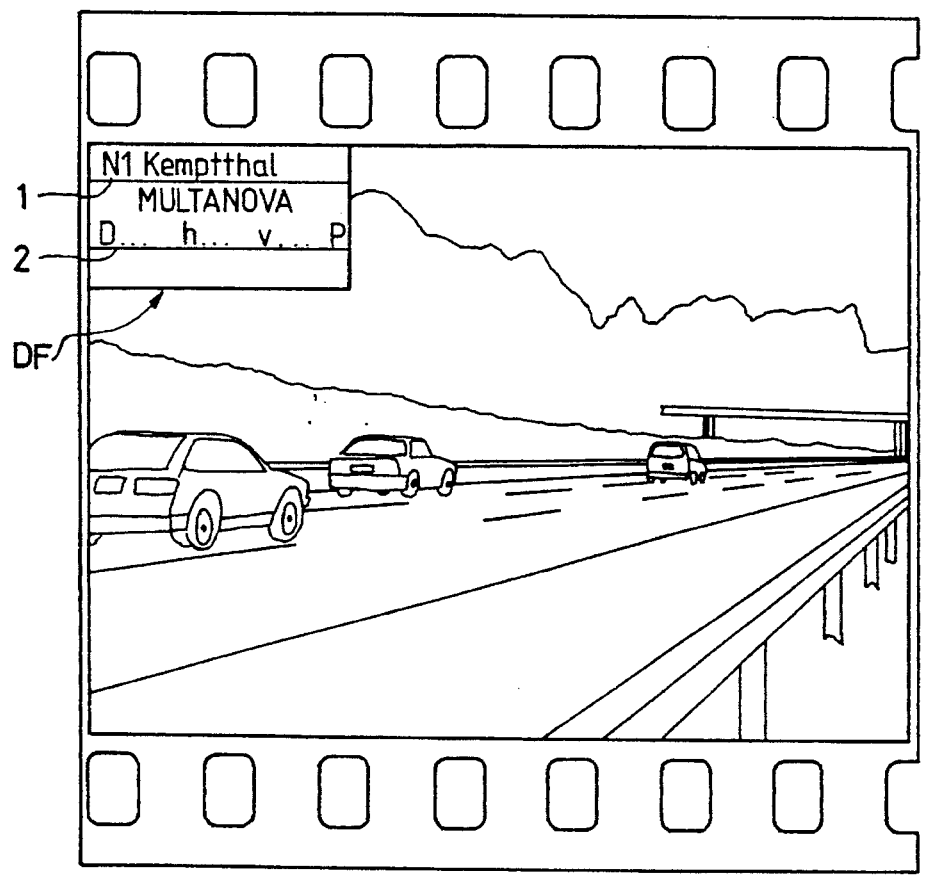
FIG. 1 is a diagrammatic reproduction of a photograph made by a speed measuring system.
FIG. 2 is an enlarged partial detail from FIG. 1.

The photograph shown in FIG. 1 is of a known type, as is produced, for example, using the MULTANOVA 6F photographing radar speed measuring system supplied by MULTANOVA AG (MULTANOVA being a registered trademark of the company Zellweger Uster AG). For a detailed description of such a speed measuring system, see EP-B-0,188,694 and the prior art cited therein. Such a measuring system is erected alongside or above a road section to be monitored, for example in a stationary booth, in a vehicle or on a stand. It determines, in accordance with known Doppler principles, the speed of the vehicles passing the measuring position. For precision, the speeds of vehicles travelling away from the system and of those approaching it are measured. If a vehicle exceeding the respective speed limit is measured, then this vehicle is photographed and at the same time the data required for the subsequent punishment of the infringement are incorporated into a data field DF, which is preferably provided in the top left-hand corner of the photograph.

As shown, the data field DF includes a line 1 for an arbitrarily inscribable designation strip. This strip of information can also be photographed, and includes the more detailed information regarding the measuring location. The data field DF also includes a data line 2 for the required statements of date D, time h and speed v. A test or validation symbol P is also present in the data field P. This symbol is explained later with reference to FIG. 2. The photograph illustrated in FIG. 1 thus shows the offending vehicle, and, in the case of photography from the front, i.e., when monitoring the approaching traffic, its driver as well, in addition to the place, date, time and measured speed, i.e. the magnitude of the infringement, The designation strip in line 1 does not necessarily need to be present, and the data line 2 can of course also include additional data.

Figure 3:
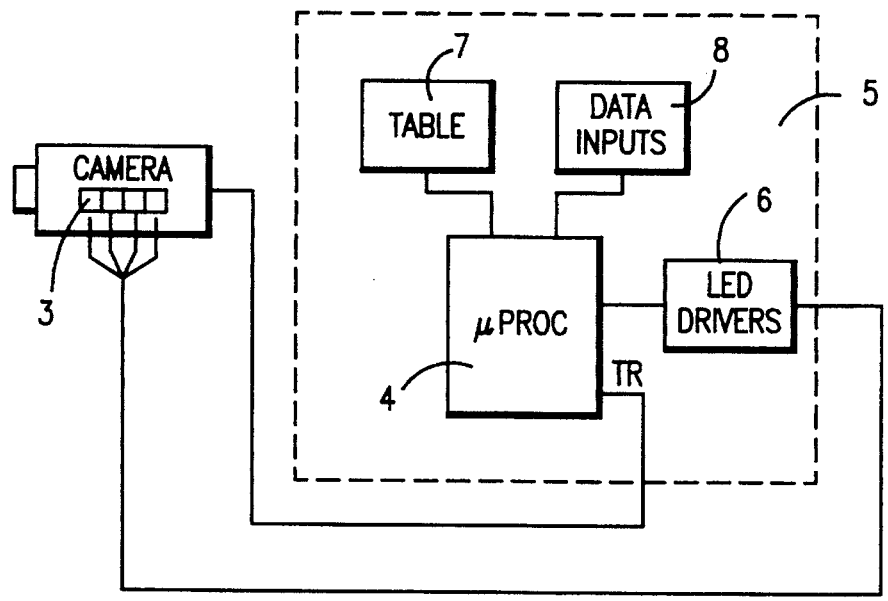
FIG. 3 is a block diagram of a circuit for implementing the invention.

The addition of the data field DF to the photograph takes place by a device, included in the camera, for the transfer of alphanumeric information onto the film. Referring to FIG. 3, this device includes light emitting diodes 3 for the display of the alphanumeric symbols and an imaging system (not shown) to image these symbols onto the film plane. In this case, the light-emitting diodes are driven, inter alia, by a microcomputer 4 in the measuring system 5, which microcomputer evaluates the speed measurement results and produces a triggering signal TR to actuate the camera when the measured speed exceeds a certain value.

FIG. 2 shows an enlarged representation of the data line 2 of the data field DF (FIG. 1 ). It is possible to observe, in the sequence from left to right, the date D, time h and measured speed v, that is to say alphanumeric data symbols which stand for the measured data. At the end of the line, a further alphanumeric symbol is included after the speed v. This is a test symbol P for checking the correct functioning of the data incorporation process.

The formation of the test symbol P takes place in the microcomputer 4 of the measuring system by combination of the data symbols of the data line 2 in accordance with a particular algorithm. The microcomputer controls a set of LED drivers 6 to actuate the light-emitting diodes 3 to display the respective test symbol P, and this is added into the data field DF in a manner similar to the data symbols. To subsequently validate the data, the same algorithm is applied to the data symbols which are visible in the data line 2, and the result obtained thereby is compared with the test symbol P imaged in the data line. If the two values do not agree, there is a data recording error. In certain circumstances, it may be sufficient to validate only the critical data, such as the measured speed v, in this manner. Preferably, however, the test symbol P is formed with reference to all data symbols for date D, time h and speed v, so that all data symbols of the data line 2 are also validated.

Figure 4:
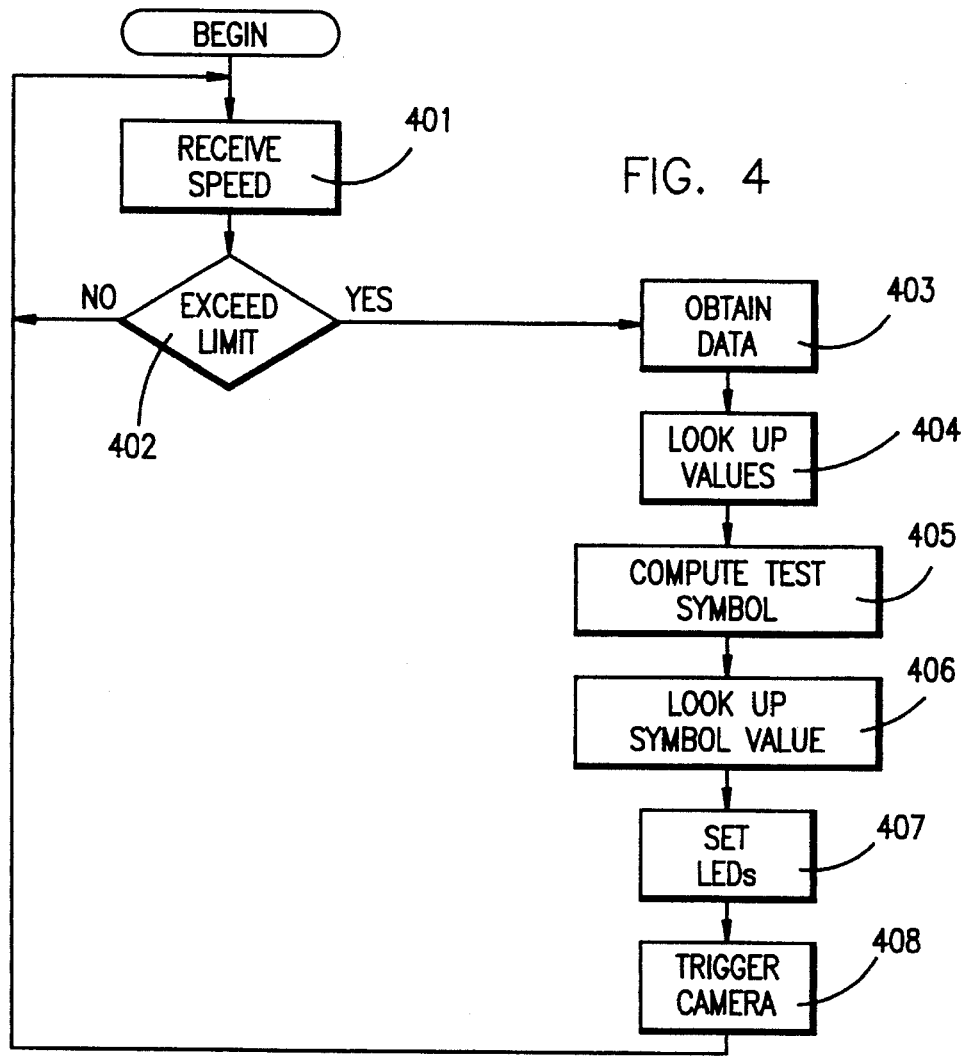
FIG. 4 is a flow chart of the process carried out by the circuit.

Referring to FIGS. 3 and 4, one example of an algorithm for determining and recording the test symbol P in the image will now be described. Associated with the microprocessor 4 is a table 7 which stores a numerical value for each alphanumeric symbol that might be encountered in the data supplied to the microprocessor. In this case, alphanumeric symbol means not only letters and numbers, but also punctuation, empty fields and mathematical or other symbols. A suitable table, for example, is the ASCII Table used in data processing. Although illustrated as a separate element in FIG. 3, the table 7 can be stored in a ROM which forms part of the memory for the microprocessor 4.

In operation, the microprocessor receives measured speed values, and perhaps other data, through a suitable input device 8 (FIG. 4, Step 401 ). Each measured speed value is compared to the speed limit, to determine whether the limit has been exceeded (Step 402). When the speed limit has been exceeded, the microprocessor obtains the data that is to be recorded on the film, e.g. data, time and measured speed (Step 403). For each data symbol that is to be recorded, its corresponding numerical value, e.g. ASCII value, is looked up in the table 7 (Step 404). In FIG. 2, the corresponding ASCII value is shown below the data line 2 for each data symbol of line 2.

These numerical values are employed to compute the test symbol P (Step 405). More particularly, as shown in FIG. 2, the numerical values are added to form a sum of digits Q, and a limiting number is formed from this sum of digits by a remainder categorization using an appropriate modulus. The modulus is determined so that an ASCII value is obtained, to which a displayable alphanumeric symbol corresponds. In the example of FIG. 2, the remainder category modulo 128 is formed from the sum of digits Q, which gives the limiting number 1 21. The microprocessor looks this number up in the table 7, to obtain the corresponding test symbol to be recorded on the film (Step 406). In the example of FIG. 2, the number 121 corresponds to the letter "Y" in the ASCII table. This letter now forms the test symbol P and is placed at the end of the data line 2. Of course, in place of this particular algorithm it is also possible to use other redundancy-forming algorithms employed in digital data processing.

Once all of the data symbols have been determined, the microprocessor commands the LED drivers 6 to actuate the LEDs 3 in the camera to display those symbols (Step 407). The camera is then triggered at Step 408 to photograph the vehicle and record the data displayed on the LEDs 3.

In the illustrated embodiment, one test symbol P is generated per data line, which symbol consists of the combination of all data symbols of this line, using the described algorithm. An individual error is reliably detected by this process, since the symbol which is displayed erroneously contributes to a sum of digits which no longer corresponds to the recorded test symbol P. While the individual error cannot be localized this is not a serious problem. Even where an error has been localized, and accordingly it is possible for example to say that the speed is actually correct, but not the date, such a result would not satisfy the requirements placed upon an item of evidence that is admissible for legal purposes. In other words, unless all of the data can be validated, the photograph has little evidentiary value. Accordingly, it will be advisable to discard, at the evaluation stage, a photograph with erroneous data and in such circumstances it is not necessary to be able to localize the error.

A number of errors would remain undetected only if they compensate for one another precisely so that the correct sum of digits is formed; however, this is rather improbable. If multiple errors are also to be reliably detected, a plurality of test symbols can be added to the data symbols and the algorithms can be applied in such a manner that each symbol contributes in a different manner to the formation of this plurality of test symbols.

Of course, the described process is not limited to the validation of data which is incorporated into a photographically produced image. The manner of the production of the image and its medium are secondary. The process can therefore also be applied in the case of video images, for example.

What is claimed is:

1. In a system for automatically monitoring the speed of traffic vehicles of the type in which an image of a vehicle is recorded along with a data field that includes data pertaining to the speed of the vehicle and other data, a process for validating the data recorded in said data field, comprising the steps of processing said data to determine a test symbol that is based upon said data, recording said test symbol in said data field along with said data, and determining, with reference to said test symbol, whether information represented by said data is correct.

2. A device for validating data that is incorporated into an image in the form of alphanumeric symbols, comprising:
   means for assigning a numerical value to each symbol in said data, said assigning means including a memory which stores a table of numerical values for all possible data symbols;
   a processor for processing said numerical values to derive a test information item that is based upon said data; and
   a recording device for recording said test information item on the image along with said data.

3. The device of claim 2, wherein said processor receives numerical values corresponding to data symbols from said memory and forms a total value therefrom, receives an alphanumerical symbol from said memory corresponding to said total value, and provides said alphanumeric symbol to said recording device to be recorded as said test information item.

4. A process for validating alphanumeric data that is incorporated into an image, comprising the steps of:
   producing alphanumeric data symbols that are related to the image and are to be incorporated therein;
   deriving a validation information item from at least some of said data symbols;
   incorporating said dam symbols and said validation information item in said image; and
   determining, with reference to said validation information item, whether an error is present in information represented by the data symbols incorporated in said image.

5. The process of claim 4, wherein said deriving step includes the steps of allocating a numerical value to each of the alphanumeric symbols that represent the data that is used to derive said validation information item, processing said numerical values to form a representative total value, and deriving the validation information item from said total value.

6. The process of claim 5, wherein said validation information item that is incorporated into the image comprises an alphanumeric test symbol.

7. The process of claim 6, wherein said processing step includes the steps of adding said numerical values to form a sum and determining a remainder number from said sum with respect to a modulus, and wherein said alphanumeric test symbol is derived from said remainder number.

8. The process of claim 7, wherein said modulus has a value such that the remainder number is a numerical value which corresponds to an alphanumeric symbol, which alphanumeric symbol constitutes said test symbol.

* * * * *